United States Patent
Ho et al.

(10) Patent No.: US 8,643,433 B2
(45) Date of Patent: Feb. 4, 2014

(54) BYPASS POWER AMPLIFIER FOR IMPROVING EFFICIENCY AT LOW POWER

(75) Inventors: Min-Chung Ho, Newbury Park, CA (US); Shao-Min Hsu, Mission Viejo, CA (US); Philippe Riondet, Irvine, CA (US); Seunghwan Yoon, Costa Mesa, CA (US); Alfred Grau Besoli, Irvine, CA (US); Hooman Darabi, Laguna Niguel, CA (US); Rahul Magoon, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 6 days.

(21) Appl. No.: 13/248,850

(22) Filed: Sep. 29, 2011

(65) Prior Publication Data

US 2013/0002349 A1  Jan. 3, 2013

Related U.S. Application Data

(60) Provisional application No. 61/503,219, filed on Jun. 30, 2011.

(51) Int. Cl.
*H03F 1/14* (2006.01)

(52) U.S. Cl.
USPC .............................. 330/51; 330/151

(58) Field of Classification Search
USPC ............................. 330/51, 151
See application file for complete search history.

(56) References Cited

U.S. PATENT DOCUMENTS

| | | | |
|---|---|---|---|
| 6,329,875 B1 * | 12/2001 | Ishida et al. | 330/51 |
| 6,900,692 B2 * | 5/2005 | Kim et al. | 330/51 |
| 7,135,931 B2 * | 11/2006 | Prodanov | 330/302 |
| 7,973,600 B2 * | 7/2011 | Yu | 330/124 R |

\* cited by examiner

*Primary Examiner* — Robert Pascal
*Assistant Examiner* — Khiem Nguyen
(74) *Attorney, Agent, or Firm* — Sterne, Kessler, Goldstein & Fox P.L.L.C.

(57) ABSTRACT

Embodiments of a two-stage bypass power amplifier are provided. In general, the two-stage bypass power amplifier is configured to receive a RF signal that is to be transmitted to a remote device and provide gain to the RF signal prior to the RF signal being transmitted to the remote device. The two-stage bypass power amplifier is configured to operate efficiently (in terms of power) at two different gain or output power levels and can be extended to operate efficiently at additional gain or output power levels.

17 Claims, 3 Drawing Sheets

BYPASS POWER AMPLIFIER FOR IMPROVING EFFICIENCY AT LOW POWER

CROSS REFERENCE TO RELATED APPLICATIONS

This application claims the benefit of U.S. Provisional Patent Application No. 61/503,219, filed on Jun. 30, 2011, which is incorporated herein by reference in its entirety.

FIELD OF THE INVENTION

This application relates generally to power amplifiers and more particularly to a two-stage bypass power amplifier.

BACKGROUND

Mobile devices, such as cell phones, are generally designed to transmit a radio frequency (RF) signal at a high output power level when located far away from a receiving base station (or when the transmission channel is noisy) to ensure adequate reception of the signal. Conversely, mobile devices are generally designed to transmit a RF signal at a comparatively lower output power level when located close to the receiving base station (or when the transmission channel is less noisy). Mobile devices can determine the power level at which to transmit the RF signal by, for example, using information received from the base station.

A power amplifier is used in a mobile device to amplify the RF signal prior to transmitting it to the base station. Therefore, depending on the distance of the mobile device from the base station (or the conditions of the channel between the mobile device and base station) the gain of the power amplifier can be adjusted to provide more or less amplification of the RF signal prior to transmission. For example, if the distance of the mobile device from the base station is relatively small, the gain of the power amplifier can be reduced to provide less amplification of the RF signal than if the distance of the mobile device from the base station was comparatively larger. Adjusting the gain of the power amplifier depending on the distance of the mobile device from the base station (or conditions of the channel) allows the mobile device to conserve power. In other words, the power amplifier does not need to continually operate under the assumption of worst case operating conditions (e.g., under the assumption that the mobile device is located at a far distance from the base station) and the gain of the power amplifier can be reduced, when operating conditions permit, to conserve power.

However, the power efficiency of a typical power amplifier does not scale linearly with its gain. In general, the typical power amplifier, and the impedance matching network at the output of the power amplifier, are designed to provide maximum power efficiency at a single operating gain. This single operating gain is typically set at the maximum gain that the power amplifier is expected to operate at (or at least at a very high gain). Assuming the power amplifier is designed to operate most efficiently at this high gain setting, any reduction in the gain of the power amplifier will lead to a reduction in the power amplifier's efficiency. Therefore, although reducing the gain of the power amplifier can reduce its power consumption, often the reduction in power consumption is not as significant as desired because of the further reduction in the power amplifier's efficiency.

For example, a power amplifier designed to operate at a high gain level may amplify the power of a RF signal from 1 mW to 500 mW with 40% power efficiency. At 40% power efficiency, the power amplifier will consume around 1.25 W of power. If the gain of the same power amplifier is reduced, however, such that the power of the RF signal is amplified from 1 mW to only 50 mW (a ten times reduction in the gain), the power efficiency of the power amplifier may fall to 5%. At 5% power efficiency, the power amplifier will consume around 1 W. Thus, although the gain of the power amplifier was reduced by a factor of ten, the power consumed by the power amplifier was only reduced by 20%.

Therefore, what is needed is a system and a method for improving the efficiency of power amplifiers used when operating at lower gains or lower output power levels.

BRIEF DESCRIPTION OF THE DRAWINGS/FIGURES

The accompanying drawings, which are incorporated herein and form a part of the specification, illustrate the present invention and, together with the description, farther serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the invention. However, it will be apparent to those skilled in the art that the invention, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1:
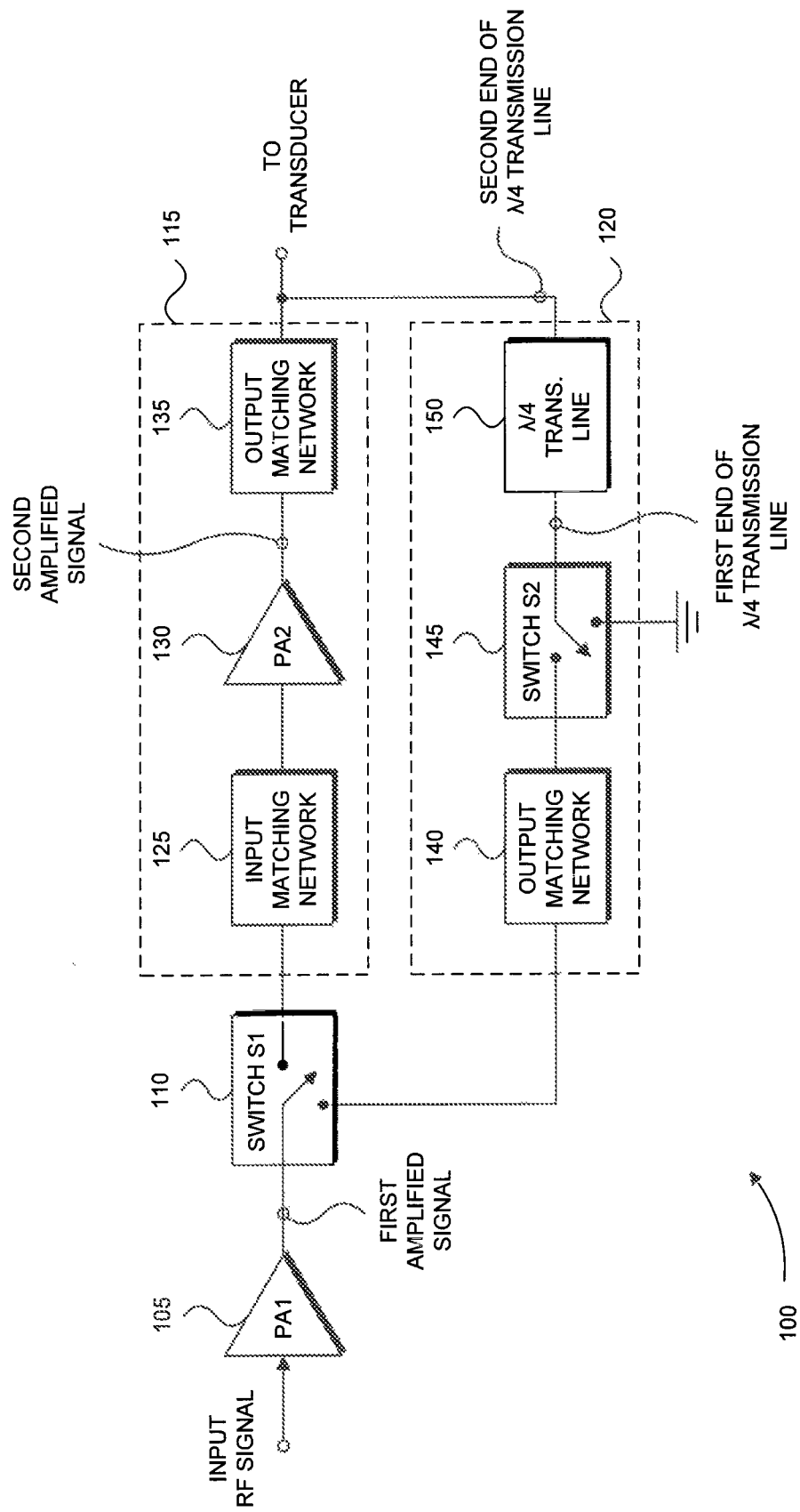
FIG. 1 illustrates a two-stage bypass amplifier, according to embodiments of the present invention.

FIG. 1 illustrates a two-stage bypass power amplifier (PA) 100, according to embodiments of the present invention. Two-stage bypass PA 100 can be implemented in a number of different wired or wireless communication devices including, for example, mobile phones, personal digital assistants (PDAs), laptop computers, and desktop computers. In general, two-stage bypass PA 100 is configured to receive a RF signal that is to be transmitted to a remote device and provide gain to the RF signal prior to the RF signal being transmitted to the remote device. Two-stage bypass PA 100 is configured to operate efficiently (in terms of power) at two different gain or output power levels and can be extended to operate efficiently at additional gain or output power levels as will be appreciated by one of ordinary skill in the art based on the teachings herein.

As illustrated in FIG. 1, two-stage bypass PA 100 specifically includes a first PA 105, a first switch (S1) 110, a gain path 115, and a gain path 120. By utilizing two different gain paths, each path can be designed to operate efficiently at a different gain. Gain path 115 includes an input matching network 125, a second PA 130, and an output matching network 135. Gain path 120 includes an output matching network 140, a second switch (S2) 145, and a quarter wavelength transmission line 150, where the quarter wavelength transmission line 150 is determined at the frequency of interest (e.g. center frequency) of the input RF signal. Gain path 115 is configured to efficiently (in terms of power) provide the RF signal at a first power level to a transducer (not shown), such as an antenna or a cable, and second gain path 115 is configured to efficiently (in terms of power) provide the RF signal at a second power level to the transducer. The first power level is greater than the second power level.

In specific operation of two-stage bypass PA 100, an input RF signal to be transmitted is initially received by first PA 105. First PA 105 is configured to amplify the RF signal to provide a first amplified RF signal. Switch 110 is then configured to couple the first amplified RF signal to one of the two gain paths (i.e., either gain path 115 or 120) depending on the desired output power level for the RF signal.

Assuming a high output power level is desired, switch 110 is controlled to bypass gain path 120 by coupling the first amplified RF signal to gain path 115. Switch 145 is further controlled to couple a first end of quarter wavelength transmission line 150 to ground. By coupling the first end of quarter wavelength transmission line 150 to ground, the second end of quarter wavelength transmission line 150 appears as a high impedance (and, in theory, an infinite impedance) to the RF signal provided at the output of gain path 115. Thus, quarter wavelength transmission line 150 substantially prevents the load of gain path 120, which includes output matching network 140, from interfering with the RF signal provided at the output of gain path 115.

After switches 110 and 145 are controlled as described above, the first amplified RF signal is received by input matching network 125 from first PA 105. In general, input matching network 125 is configured to match the output impedance of first PA 105 to the input impedance of second PA 130. By matching the output impedance of first PA 105 to the input impedance of second PA 130 reflections are minimized and power transfer is maximized. Input matching network 125 can include one or more capacitive, inductive, and/or resistive components.

After being processed by input matching network 125, the first amplified RF signal is received by second PA 130. Second PA 130 is configured to amplify the first amplified RF signal to provide a second amplified RF signal. The second amplified RF signal is then provided to the transducer, via output matching network 135, for transmission. In general, output matching network 135 is configured to match the output impedance of second PA 130 to the input impedance of the transducer. By matching the output impedance of second PA 130 to the input impedance of the transducer reflections are minimized and power transfer is maximized. Output matching network 135 can include one or more capacitive, inductive, and/or resistive components.

Assuming now that a low output power level is desired, switch 110 is controlled to bypass gain path 115 by coupling the first amplified RF signal to gain path 120. Switch 145 is further controlled to couple a first end of quarter wavelength transmission line 150 to the output of output matching network 140. The first end of quarter wavelength transmission line 150 appears as a low impedance (and, in theory, a zero impedance path) to the RF signal provided at the output of matching network 140 and couples the RF signal to the transducer.

After switches 110 and 145 are controlled as described above, the first amplified RF signal is received by output matching network 140 from first PA 105. In general, output matching network 140 is configured to match the output impedance of first PA 105 to the input impedance of the transducer. By matching the output impedance of first PA 105 to the input impedance of the transducer reflections are minimized and power transfer is maximized. Output matching network 140 can include one or more capacitive, inductive, and/or resistive components.

Importantly, it should be noted that second PA 130 can be turned off when gain path 115 is being bypassed and gain path 120 is being utilized to conserve power.

It should be further noted that quarter wavelength transmission line 150 provides an effective means for isolating the output of gain path 115 from the load presented by gain path 120 and its use has several associated benefits. For example, the use of quarter wavelength transmission line 150 as an isolation means allows two-stage bypass PA 100 to be more efficiently implemented in a conventional complementary metal oxide semiconductor (CMOS) process. More specifically, because the output RF signal from gain path 115 can have a significant voltage magnitude (e.g., 15-20 V) a typical MOS switch in a CMOS process cannot, by itself, be used to provide isolation because at such high voltages conventional MOS switches break down. Although several MOS switches can be stacked together in cascode form to absorb the potentially large voltages at the output of gain path 115 and provide isolation, such an implementation is inefficient in terms of power.

Figure 2:
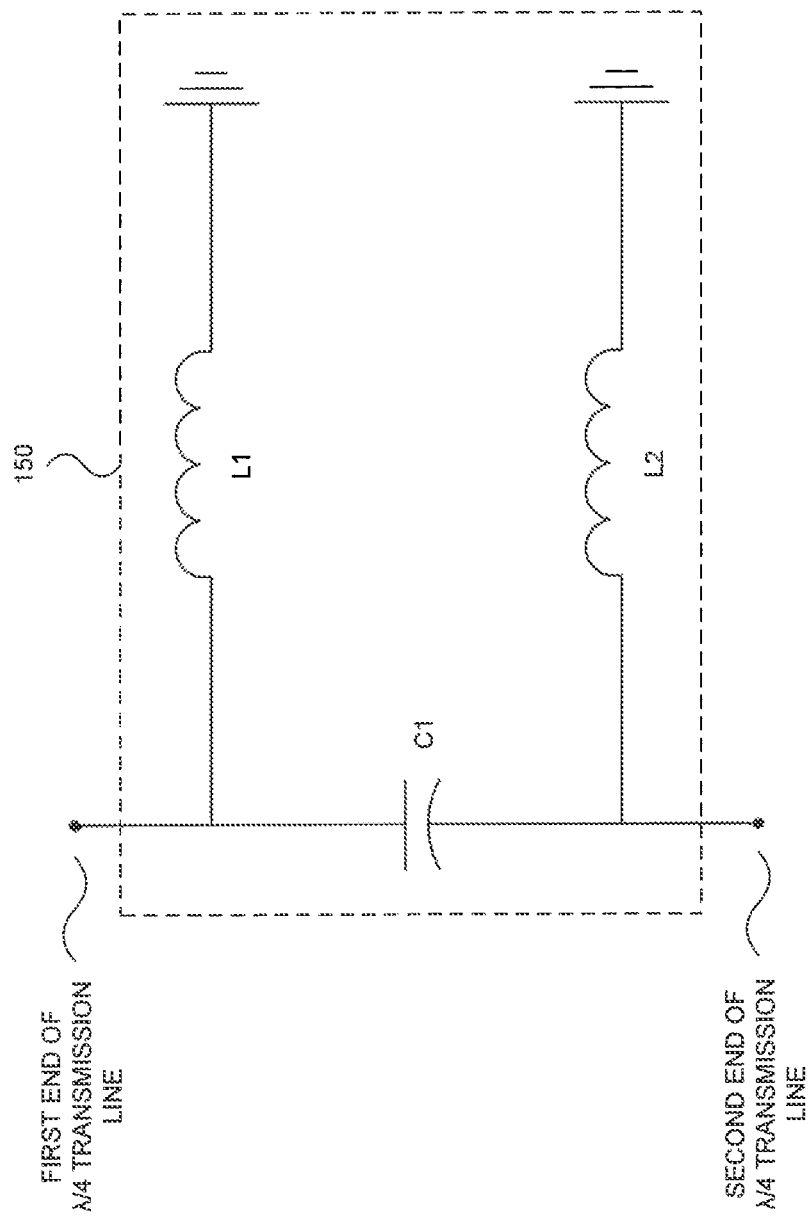
FIG. 2 illustrates a quarter wavelength transmission line, according to embodiments of the present invention.

FIG. 2 illustrates one exemplary implementation of quarter wavelength transmission line 150 that substantially overcomes the issue described above, according to embodiments of the present invention. As illustrated in FIG. 2, quarter wavelength transmission line 150 includes a capacitor C1, a first inductor L1, and a second inductor L2. Capacitor C1 is coupled between the first and second ends of quarter wavelength transmission line 150, inductor L1 is coupled to the first end of quarter wavelength transmission line 150 and ground, and inductor L2 is coupled to the second end of quarter wavelength transmission line 150 and ground. In one embodiment, capacitor C1 can be fully integrated on a chip together with the rest of two-stage bypass amplifier 100, illustrated in FIG. 1, and inductors L1 and L2 can be implemented using bond wires coupled to the chip and ground.

Figure 3:
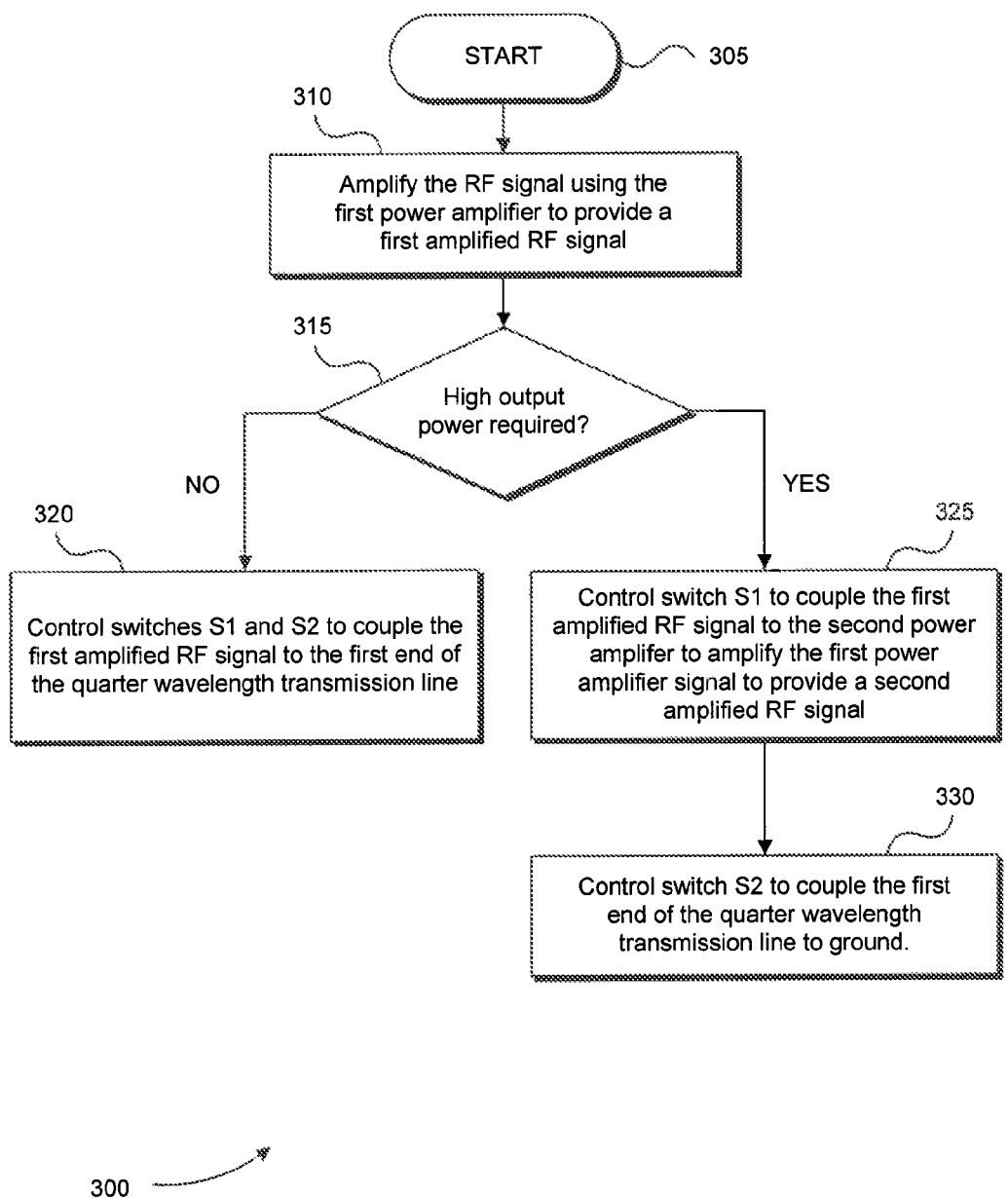
FIG. 3 illustrates a method for operating a two-stage bypass amplifier, according to embodiments of the present invention.

Referring now to FIG. 3, a flowchart 300 of a method for operating a two-stage bypass amplifier is illustrated, according to embodiments of the present invention. Flowchart 300 is described with continued reference to exemplary two-stage bypass amplifier 100 depicted in FIG. 1. However, flowchart 300 is not limited to that embodiment.

Flowchart 300 starts at step 305 and transitions to step 310. In step 310, an input RF signal to be transmitted is amplified using first PA 105 to provide a first amplified RF signal.

In step 315, a determination is made as to whether a high output transmission power (or alternatively a low output transmission power) is desired. If a low output transmission power is desired, flowchart 300 transitions to step 320. If, on the other hand, a high output transmission power is desired, flowchart 300 transitions to step 325.

Assuming a low output transmission power is desired, flowchart 300 transitions from step 315 to step 320. At step 320, switch 110 is controlled to bypass gain path 115 by coupling the first amplified RF signal to gain path 120, and switch 145 is controlled to couple a first end of quarter wavelength transmission line 150 to the output of output matching network 140. The first end of quarter wavelength transmission line 150 appears as a low impedance to the RF signal provided at the output of matching network 140 and couples the RF signal to the transducer.

Assuming a high output transmission power is desired, flowchart 300 transitions from step 315 to step 325. At step 325, switch 110 is controlled to bypass gain path 120 by coupling the first amplified RF signal to gain path 115, and switch 145 is controlled to couple a first end of quarter wavelength transmission line 150 to ground. By coupling the first end of quarter wavelength transmission line 150 to ground, the second end of quarter wavelength transmission line 150 appears as a high impedance (and, in theory, an infinite impedance) to the RF signal provided at the output of gain path 115. Thus, quarter wavelength transmission line 150 substantially prevents the load of gain path 120, which includes output matching network 140, from interfering with the RF signal provided at the output of gain path 115. After the switches are controlled as described above, the first amplified signal provided by first PA 105 is processed by input matching network 125 and second PA 130. Second PA 130 is configured to amplify the first amplified RF signal to provide a second amplified RF signal. The second amplified RF signal is then provided to the transducer, via output matching network 135, for transmission.

The present invention has been described above with the aid of functional building blocks illustrating the implementation to interpret the claims. The Abstract section may set forth one or more but not all exemplary embodiments of the present invention as contemplated by the inventor(s), and thus, is not intended to limit the present invention and the appended claims of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An apparatus for amplifying a radio frequency (RF) signal for transmission, comprising:
   a first power amplifier configured to amplify the RF signal to provide a first amplified RF signal;
   a second power amplifier configured to amplify the first amplified RF signal to provide a second amplified RF signal to an input of a transducer;
   an input matching network coupled between the first power amplifier and the second power amplifier and configured to match an output impedance of the first power amplifier to an input impedance of the second power amplifier;
   a quarter wavelength transmission line comprising a first end and a second end, the quarter wavelength transmission line configured to receive the first amplified RF signal at the first end and couple the first amplified RF signal to the input of the transducer at the second end;
   an output matching network coupled between the first power amplifier and the quarter wavelength transmission line and configured to match the output impedance of the first power amplifier to an input impedance of the transducer; and
   a first switch configured to couple the first amplified RF signal to the second power amplifier or to the first end of the quarter wavelength transmission line.

2. The apparatus of claim 1, further comprising:
   a second switch configured to couple the first end of the quarter wavelength transmission line to the first amplified RF signal or to ground.

3. The apparatus of claim 2, wherein the second switch is configured to couple the first end of the quarter wavelength transmission line to ground when the second power amplifier is being used to amplify the first amplified RF signal.

4. The apparatus of claim 2, wherein the output matching network is coupled between the first switch and the second switch.

5. The apparatus of claim 1, further comprising:
   a second output matching network coupled between the second power amplifier and the transducer.

6. The apparatus of claim 5, wherein the second output matching network is configured to match the output impedance of the second power amplifier to the input impedance of the transducer.

7. The apparatus of claim 1, wherein the quarter wavelength transmission line comprises a first inductor coupled between the first end and ground, a second inductor coupled between the second end and ground, and a capacitor coupled between the first end and the second end.

8. The apparatus of claim 7, wherein the first inductor and the second inductor are implemented using bond wires.

9. The apparatus of claim 1, wherein the input matching network is coupled between the first switch and the second power amplifier.

10. An apparatus for amplifying a radio frequency (RF) signal for transmission, comprising:
    a first power amplifier configured to amplify the RF signal to provide a first amplified RF signal;
    a second power amplifier configured to amplify the first amplified RF signal to provide a second amplified RF signal to an input of a transducer;
    an input matching network coupled between the first power amplifier and the second power amplifier and configured to match an output impedance of the first power amplifier to an input impedance of the second power amplifier;
    a capacitor comprising a first end and a second end, the capacitor configured to receive the first amplified RF signal at the first end and couple the first amplified RF signal to the input of the transducer at the second end;
    an output matching network coupled between the first power amplifier and the capacitor and configured to match the output impedance of the first power amplifier to an input impedance of the transducer; and a first switch configured to couple the first amplified RF signal to the second power amplifier or to the first end of the capacitor.

11. The apparatus of claim 10, further comprising:

a first inductor coupled between the first end and ground; and a second inductor coupled between the second end and ground.

12. The apparatus of claim 11, wherein the first inductor is a bond wire and the second inductor is a bond wire.

13. The apparatus of claim 10, further comprising:

a second switch configured to couple the first end of the capacitor to the first amplified RF signal or to ground.

14. The apparatus of claim 13, wherein the second switch is configured to couple the first end of the capacitor to ground when the second power amplifier is being used to amplify the first amplified RF signal.

15. The apparatus of claim 13, wherein the output matching network is coupled between the first switch and the second switch.

16. The apparatus of claim 10, further comprising:

a second output matching network coupled between the second power amplifier and the transducer, wherein the second output matching network is configured to match the output impedance of the second power amplifier to the input impedance of the transducer.

17. The apparatus of claim 10, wherein the input matching network is coupled between the first switch and the second power amplifier.

* * * * *